(12) United States Patent
Zeller et al.

(10) Patent No.: US 8,185,080 B2
(45) Date of Patent: May 22, 2012

(54) HARMONIC REJECTION MIXER

(75) Inventors: Sebastian Zeller, Grassbrunn (DE);
Peter Kirchlechner, Grassbrunn (DE);
Martin Frey, Grassbrunn (DE)

(73) Assignee: STMicroelectronics Design & Application GmbH, Grassbrunn (DE)

( * ) Notice: Subject to any disclaimer, the term of this patent is extended or adjusted under 35 U.S.C. 154(b) by 263 days.

(21) Appl. No.: 12/609,517

(22) Filed: Oct. 30, 2009

(65) Prior Publication Data
US 2011/0105018 A1   May 5, 2011

(51) Int. Cl.
*H04B 1/26* (2006.01)
(52) U.S. Cl. .......... 455/302; 455/315; 455/323
(58) Field of Classification Search .......... 455/295, 455/296, 302, 305, 313, 314, 315, 317, 318, 455/323, 326
See application file for complete search history.

(56) References Cited

U.S. PATENT DOCUMENTS

| | | | | |
|---|---|---|---|---|
| 6,922,555 B1 * | 7/2005 | Mohindra | ...... | 455/314 |
| 2005/0239430 A1 * | 10/2005 | Shah | ...... | 455/326 |
| 2010/0240335 A1 * | 9/2010 | Rafi et al. | ...... | 455/323 |

* cited by examiner

*Primary Examiner* — Thanh Le
(74) *Attorney, Agent, or Firm* — Seed IP Law Group PLLC

(57) ABSTRACT

A harmonic rejection mixer for carrying out a frequency translation of a mixer input signal having a mixer input frequency, the mixer including an up-conversion mixer for generating an intermediate signal by multiplying the mixer input signal with a first local oscillation signal having a first local oscillation frequency, and a down-conversion mixer for generating a mixer output signal by multiplying the intermediate signal with a second local oscillation signal having a second local oscillation frequency. The first local oscillation frequency and the second local oscillation frequency are greater than the mixer input frequency. The first local oscillation signal is an l-time oversampled sine wave and the second local oscillation signal is an m-time oversampled sine wave.

25 Claims, 2 Drawing Sheets

HARMONIC REJECTION MIXER

BACKGROUND

1. Technical Field

The present disclosure is directed to a harmonic rejection mixer having an up-conversion mixer and a down-conversion mixer.

2. Description of the Related Art

Electronic mixers are devices used for translating a signal from a first frequency to a second frequency. They are commonly used in transmitters and receivers of communication systems, such as radio transmission systems. On the transmitter side, a base band signal is translated from a base band to a carrier frequency, often denoted as radio frequency $f_{RF}$. Accordingly, on the receiver side, the incoming signal is translated from the radio frequency to the base band again for being output to the user. These translations commonly have two stages. For example, on the receiving side, the received signal can be translated from the radio frequency to an intermediate frequency $f_{IF}$ first, because some of the signal processing, such as amplifying or filtering, may be done more easily/efficiently at this frequency. From the intermediate frequency, the signal is translated to the base band in a subsequent step. For each of these translation stages, a mixer is used. The mixing operation involves the multiplication of the respective information carrying signal with a local oscillation signal having a local oscillation frequency $f_{LO}$.

For the translation from the radio frequency $f_{RF}$ to the intermediate frequency $f_{IF}$, the local oscillation frequency $f_{LO}=f_{RF}-f_{IF}$ or $f_{LO}=f_{RF}+f_{IF}$ is used. An according mixer is illustrated in FIG. 1. A square wave signal is often used as the local oscillation signal. However, such a square wave signal includes not only a spectral component at the local oscillation frequency $f_{LO}$, but also at odd harmonics of $f_{LO}$, i.e., at odd multiples of $f_{LO}$. As no or only low performance band pass filters around the desired radio frequency $f_{RF}$ are commonly used before the mixing operation, the multiplication with the local oscillation signal introduces further spectral components of the received signal, which do not have the desired radio frequency $f_{RF}$, into the intermediate frequency $f_{IF}$. This degrades the signal quality at the mixer output. In modern, high performance receivers, such a signal degradation due to undesired components being mixed onto the mixer output frequency is highly undesirable.

Accordingly, it would be beneficial to provide a mixer architecture, that reduces the signal degradation caused by the harmonics of the local oscillation signal.

BRIEF SUMMARY

According to an embodiment of the present disclosure, a harmonic rejection mixer for carrying out a frequency translation of a mixer input signal having a mixer input frequency is provided, wherein the harmonic rejection mixer includes an up-conversion mixer for generating an intermediate signal by multiplying the mixer input signal with a first local oscillation signal having a first local oscillation frequency, and a down-conversion mixer for generating a mixer output signal by multiplying the intermediate signal with a second local oscillation signal having a second local oscillation frequency, wherein the first local oscillation frequency and the second local oscillation frequency are greater than the mixer input frequency, and wherein the first local oscillation signal is an l-time oversampled sine wave and the second local oscillation signal is an m-time oversampled sine wave.

With this harmonic rejection mixer architecture, the undesired spectral components introduced into the mixer output frequency are greatly reduced. In both the up-conversion mixer and the down-conversion mixer, the local oscillation signals are oversampled sine waves, wherein m and l are integer numbers. A k-time oversampled sine wave is defined as a signal that results from sampling a sine wave 2*k times per signal period and holding the sampled value until the next sampling time. In other words, a sine wave after a sample and hold operation with the sample frequency $2*k*f_{LO}$ is considered a k-times oversampled local oscillation signal. Such k-times oversampled sine waves have the property that all harmonics except for the harmonics with the harmonic numbers $(2*k*N\pm1)$ are suppressed, with N=1, 2, 3, etc. For example, for a six-time oversampled sine wave, only the harmonics 11, 13, 23, 25, etc., are present in the spectrum. However, these harmonics are suppressed with 1/n, as compared to the fundamental frequency $f_{LO}$, with n being the harmonic number. For example, the 13th harmonic has only $\frac{1}{13}$ times the amplitude of the fundamental spectral component. Accordingly, the harmonic components of the local oscillation signals, and therefore the undesired received signal components translated into the mixer output signal, are either completely suppressed or greatly reduced. Moreover, there are two instances of reduction of harmonic components, which allows for excellent harmonic rejection.

In accordance with another aspect of the present disclosure, a circuit is provided that includes a harmonic rejection mixer that reduces signal degradation caused by harmonics of a local oscillation signal. The mixer includes an up-conversion mixer circuit that receives a mixer input signal and multiplies the mixer input signal with a first local oscillation signal having a first local oscillation frequency greater than a frequency of the mixer input signal to generate an intermediate signal; and a down-conversion circuit coupled to the up-conversion circuit that multiplies the intermediate signal with a second local oscillation signal that has a frequency substantially the same as the frequency of the first local oscillation frequency and generates a mixer output signal having suppressed harmonics that are suppressed with a 1/n characteristic in which n comprises the harmonic number.

In accordance with another aspect of the foregoing circuit, the circuit includes a low pass filter coupled to the up-conversion mixer to receive the intermediate signal and that filters the intermediate signal to generate a filtered intermediate signal that is received at the down-conversion circuit.

In accordance with another aspect of the foregoing circuit, the first local oscillation signal is an l-time oversampled sine wave and the second local oscillation signal is an m-time oversampled sine wave.

In accordance with yet a further aspect of the foregoing circuit, l and m can be different numbers, can be multiples of 2, or l can be greater than m. Alternatively, in accordance with an alternative embodiment of the circuit, l equals 6 and m equals 4.

BRIEF DESCRIPTION OF THE SEVERAL VIEWS OF THE DRAWINGS

Embodiments of the present disclosure are described in greater detail below with reference to the figures, wherein.

DETAILED DESCRIPTION

Figure 1:
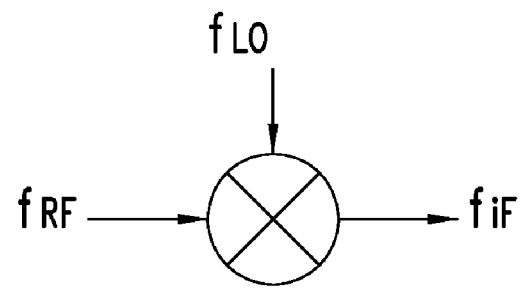
FIG. 1 shows a block diagram of a previous approach mixer.
Figure 2:
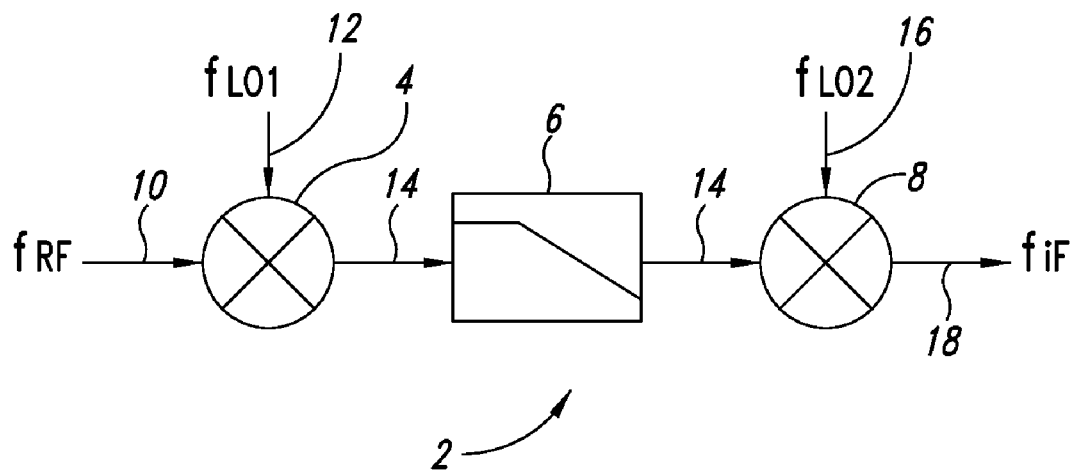
FIG. 2 shows a block diagram of a harmonic rejection mixer in accordance with an embodiment of the disclosure.

In FIG. 2, a block diagram of a harmonic rejection mixer 2 in accordance with an embodiment of the disclosure is shown. The exemplary harmonic rejection mixer 2 is used in a receiver. It includes an up-conversion mixer 4, a low pass filter 6, and a down-conversion mixer 8. A mixer input signal 10 is input into the up-conversion mixer 4. The term mixer input signal denotes a desired frequency component of the wide frequency spectrum received by the receiver front end, such as the antenna (not shown). Accordingly, the mixer input signal has a desired radio frequency $f_{RF}$, which is to be translated to an intermediate frequency $f_{IF}$. As the mixer is designed to translate this particular desired radio frequency to the intermediate frequency, it is herein referred to as the mixer input frequency, although a wide frequency spectrum is usually supplied to the mixer. The width of this spectrum depends on the antenna design and optional pre-selection filtering on the received RF spectrum upstream of the mixer. The spectral component at the desired radio frequency, i.e., the mixer input frequency, contains the information that is eventually output to the user of the receiver.

The mixer input signal 10 is multiplied with a first local oscillation signal 12 in the up-conversion mixer 4, with the multiplication yielding the intermediate signal 14. This intermediate signal 14 is low pass filtered in the low pass filter 6 to generate a filtered intermediate signal before being multiplied with a second local oscillation signal 16 in the down-conversion mixer 8, with the multiplication yielding the mixer output signal 18. Accordingly, the up-conversion mixer 4 is coupled to the low pass filter 6, which in turn is coupled to the down-conversion mixer 8, with the signal path reaching from the up-conversion mixer 4 to the low pass filter 6 and to the down-conversion mixer 8.

Figure 3:
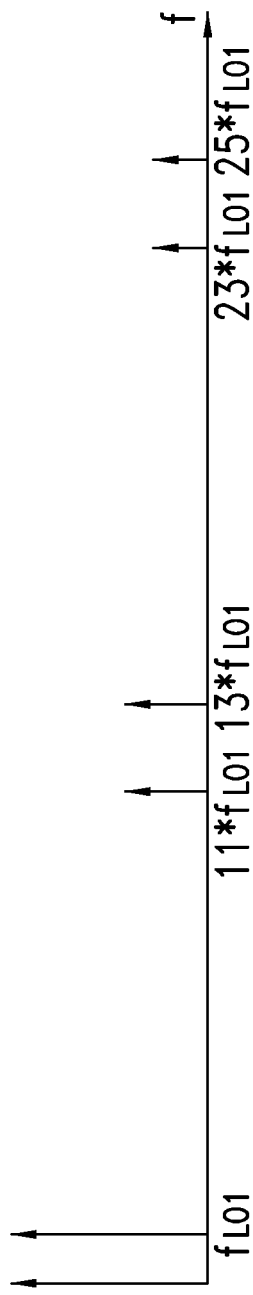
FIG. 3 shows a diagram depicting the spectrum of the first local oscillation signal in accordance with an embodiment of the disclosure.
Figure 4:
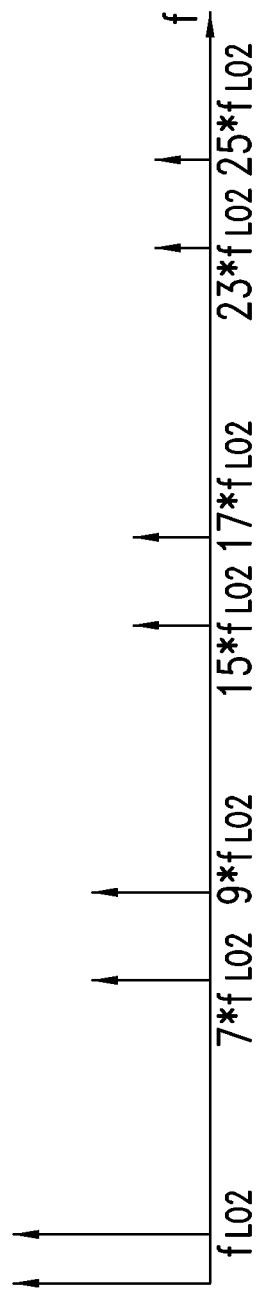
FIG. 4 shows a diagram depicting the spectrum of the second local oscillation signal in accordance with an embodiment of the disclosure.

The operation of the harmonic rejection mixer 2 is described as follows, wherein reference is also made to the spectrums of the first and second local oscillation signals as shown in FIGS. 3 and 4. It is noted that FIGS. 3 and 4 are not to scale, particularly that it cannot be derived from FIGS. 3 and 4 that the first local oscillation frequency $f_{LO1}$ equals the second local oscillation frequency $f_{LO2}$. The first local oscillation signal is a 6-time oversampled sine wave, whose spectrum is shown in FIG. 3. The harmonics 3, 5, 7, 9, 15, 17, 19, and 21 of the first local oscillation frequency $f_{LO1}$ are suppressed in the 6-time oversampled sine wave. The first local oscillation signal is referred to as having the first local oscillation frequency $f_{LO1}$, which is the fundamental frequency of this signal. However, the first local oscillation signal further includes harmonic components as shown. The complete suppression, shown for these harmonics in FIG. 2, corresponds to a 40-50 dB suppression in exemplary applications, as mixers exhibit mismatches of conversion gains and imprecision of clock phases, which prevent a complete suppression. The harmonics 11, 13, 23, and 25 are suppressed according to a 1/n characteristic, as compared to the fundamental frequency with n being the harmonic number. Accordingly, for example, the harmonics 23 and 25 are suppressed by 27 and 28 dB, respectively. A first local oscillation frequency much greater than the mixer input frequency is used for the multiplication in the up-conversion mixer 4. This multiplication has the following effects. The mixer input signal having the desired mixer input frequency $f_{RF}$ is translated to a higher up-conversion mixer output frequency. Strictly speaking, the two side bands of the mixer input signal are translated to two up-conversion mixer output frequencies $f_{LO1}-f_{RF}$ and $f_{LO1}+f_{RF}$. Moreover, the mixer input signal is translated to even higher frequencies corresponding to the harmonics of the first local oscillation frequency, such as $11*f_{LO1}-f_{RF}$, $11*f_{LO1}+f_{RF}$, $13*f_{LO1}-f_{RF}$, $13*f_{LO1}+f_{RF}$, etc. Equally, undesired signals present at the mixer input are translated into the up-conversion mixer output frequencies $f_{LO1}-f_{RF}$ and $f_{LO1}+f_{RF}$. For example, a signal received from the antenna at $12*f_{LO1}-f_{RF}$ is translated to the frequency $f_{LO1}-f_{RF}$ due to the 11th harmonic of the first local oscillation signal. However, this undesired signal is greatly reduced due to the 1/n characteristic of the spectrum of the first local oscillation signal. Moreover, since the first local oscillation frequency is much greater than the mixer input frequency, a low quality band pass or low pass before the mixer is sufficient to filter out such undesired components. It is apparent to a person skilled in the art that not only single spectral components are translated from one frequency to another, but that frequency bands as a whole are shifted in the frequency domain.

The intermediate signal is then optionally filtered in low pass filter 6, the operation and effect of which will be described later. In the case of no low pass filter 6 being present, the intermediate signal 14 is directly supplied to the down-conversion mixer 8. The down-conversion mixer 8 is designed to translate the intermediate signal with the desired up-conversion mixer output frequency, i.e., with either $f_{LO1}-f_{RF}$ or $f_{LO1}+f_{RF}$, to the desired intermediate frequency $f_{IF}$. From signal theory, the second local oscillation frequency is chosen to fulfill the following equation: $f_{IF}=|f_{LO2}\pm(f_{LO1}\pm f_{RF})|$. Accordingly, the second local oscillation frequency may for example be $f_{LO1}-f_{RF}-f_{IF}$ or $f_{LO1}+f_{RF}-f_{IF}$. A four-time oversampled sine wave having the second local oscillation frequency includes the spectrum as shown in FIG. 4. Multiplication of the signal, input to the down-conversion mixer, with the second local oscillation signal has the following effect: The desired intermediate signal having the desired up-conversion mixer output frequency is translated to the desired mixer output frequency, i.e., the intermediate frequency. However, other undesired signals present at the input of the down-conversion mixer are also translated into the intermediate frequency due to the harmonics of the second local oscillation frequency present in the second local oscillation signal. Again, only a very limited number of harmonics is present due to the oversampled sine wave nature of the second local oscillation signal. The harmonics 3, 5, 11, 13, 19, and 21 are suppressed by 40-50 dB, with the 40-50 dB value being the suppression limit due to gain/phase mismatch in the exemplary embodiment of FIG. 2. The harmonics 7, 9, 15, 17, 23 and 25 are suppressed with a 1/n characteristic.

The undesired signals present at the input of the down-conversion mixer due to the spectrum of the first local oscillation signal are of particular interest. These undesired signals are also present in implementations with a band pass filter before the up-conversion mixer, because they arise from the signals within a frequency band around the desired radio frequency, which are usually not filtered out by an upstream band pass or low pass filter due to its limited spectral selectivity. As the first local oscillation frequency is chosen to be much larger than the mixer input frequency, i.e., the desired radio frequency, the second local oscillation frequency may turn out to be comparably large as compared to the first local oscillation frequency. Accordingly, undesired signals being present at the down-conversion mixer input around the 23rd and 25th harmonics of the first local oscillation frequency are translated to the intermediate frequency by the 23rd and 25th harmonics of the second local oscillation frequency. The architecture of the exemplary mixer of FIG. 2, however, allows for an excellent reduction of these signals, as the spectrums of both the first and second local oscillation signals experience an enormous decrease at such high harmonics due to the 1/n characteristic. Consequently, the 1/n characteristic is applied twice, which reduces these undesired signals, which stem from frequencies that are around the mixer input frequency and are present at the mixer input, with a factor of (1/n)*(1/n). In this case, a suppression of the 23rd and 25th harmonic of 54 dB and 56 dB is achieved, respectively. The undesired signals in frequency bands around the harmonics 7, 9, 11, 13, 15 and 17 of the first local oscillation frequency are suppressed by 40-50 dB in one of the up-conversion mixer and the down-conversion mixer—as explained above—and by 17-25 dB in the respectively other one of the up-conversion mixer and the down-conversion mixer due to the spectral 1/n suppression. Accordingly, total suppression numbers of 57-75 dB are achieved for undesired signals around these harmonics. The harmonics 3, 5, 19 and 21 of the first local oscillation frequency are suppressed by 80-100 dB, as they are completely suppressed in both the up-conversion mixer and the down-conversion mixer, with the complete suppression being limited to 40-50 dB per mixer due to gain/phase mismatch.

It is pointed out that the higher the harmonic number is, the less critical the problem of undesired signal introduction is. The reason for this is that the first and the second local oscillation signals are in general different. The higher the harmonic number, the bigger the frequency distance between the frequency of the particular harmonic of the first local oscillation frequency and the particular harmonic of the second local oscillation frequency. Accordingly, a filtering of the signal at the mixer input has a larger effect for higher harmonics. Regarding such filtering, the decrease of the undesired signals is the larger when the further their frequency is away from the desired radio frequency. Hence, an accordingly translated undesired signal is reduced more if the down-converting frequency is further spaced from the up-converting frequency.

It is also possible to place a low pass filter 6 or band pass filter between the up-conversion mixer and the down-conversion mixer, in order to filter out particular harmonic components. In this way, the higher harmonic components of the first local oscillation signal, which are shown in FIG. 3 and which are present at the output of the up-conversion mixer, can be reduced further. In this way, the undesired signals translated into the intermediate frequency can be reduced below above mentioned suppression numbers.

Both mixers can be implemented as complex mixers to avoid image conversion. Implementing the low pass filter 6 or an alternative band pass filter as a complex-pole resonator with a finite quality factor may be preferable if both mixers are implemented as complex mixers. Tuning of the resonator can be avoided if $f_{LO2}$ is a fixed frequency. The requirements to the dynamic of the intermediate filter can be reduced by 6 dB if the received signal at $f_{RF}$ is already available as a complex signal, so that the up-conversion is single side band.

It is pointed out that the usage of oversampled cosine waves as local oscillation signals is equally possible, as the only difference between sine and cosine waves is a phase shift. A cosine wave is a merely shifted sine wave.

Moreover, the oversampled sine waves may be generated by a plurality of basic mixers operated with square waves, with their outputs being scaled and added to or subtracted from or added to and subtracted from each other.

According to a further embodiment, the mixer output signal has a mixer output frequency, which is lower than the mixer input frequency. Particularly, the mixer input frequency may be a radio frequency, and the mixer output frequency may be an intermediate frequency. In this way, the advantages described herein can be fully made use of in a known receiver signal processing chain. The present disclosure is particularly suited to low values for the mixer output frequency or even for a mixer output frequency of zero, i.e., a translation of the mixer input signal into the base band. Accordingly, the mixer output signal may be a base band signal. A particular example of an application is an AM/DRM-radio receiver with low intermediate frequency. However, the proposed architecture may also be used in transmitters.

In another embodiment, l and m are different numbers. In this way, not all of the existing harmonic numbers in the spectrum of the first oscillation signal are present in the spectrum of the second oscillation signal. Accordingly, regarding at least a portion of the harmonic numbers, a harmonic suppression limited only by gain/phase mismatch may be achieved in at least one of the up-conversion mixer and the down-conversion mixer.

Also, l and m may be multiples of 2. This allows for a comparably easy implementation of the generation of the first and second local oscillation signals, which in turn leads to few components needed, which allows for cheap implementations.

In a further embodiment, l is greater than m. For a given desired suppression of harmonics, which can be translated into a given product of l and m, it is beneficial to use the local oscillation signal first that has the higher oversampling. In this case, a low or band pass filter in between the up-conversion mixer and the down-conversion mixer has a greater effect on the mixer output signal quality. Accordingly, for a given desired product of l and m, it can be beneficial to not make l and m close to the square root of this product.

It is also possible that l equals 6 and m equals 4. This provides for an excellent trade off between circuit complexity for generating the oversampled signals and carrying out the according multiplication as well as achieving a strong suppression of the harmonics of the first and second local oscillation signals. The harmonic numbers 23 and 25 are the first harmonics that are not completely suppressed either by the up-conversion mixer or the down-conversion mixer.

In a further embodiment, the first and second local oscillation frequencies are much greater than the mixer input frequency. The distance between the frequency of a particular harmonic number of the first local oscillation signal and the frequency of the particular harmonic number of the second local oscillation signal is the bigger, the greater the local oscillation frequencies are. For a greater such distance, the undesired signals around the desired radio frequency are less likely to lay in a frequency band that is translated by both the harmonics of the first and second local oscillation signals. Hence, a pre-selection filter upstream of the up-conversion mixer is all the more effective. In particular, the first and second local oscillation frequencies may be at least 5 times greater than the mixer input frequency, preferably at least 10 times greater.

In a further embodiment, the harmonic rejection mixer includes a signal filter disposed between the up-conversion mixer and the down-conversion mixer for filtering the intermediate signal, wherein the signal filter is one of a low pass filter and a band pass filter. In this way, particular ones or all of the harmonics of the local oscillation signal that are detrimental to the mixer output signal quality can be filtered out.

In yet another embodiment, the up-conversion mixer and the down-conversion mixer are complex mixers. With this feature, image frequency rejection can be achieved in addition to harmonic rejection. The signal quality at the mixer output can be increased or the requirements for RF pre-selection filters can be reduced without having a negative effect on the mixer output signal quality. In the case of complex mixers, the signal filter between the up-conversion mixer and the down-conversion mixer may be a complex filter.

While the disclosure has been described with reference to exemplary embodiments, it will be understood by those skilled in the art that various changes may be made and equivalents may be substituted for elements thereof without departing from the scope of the disclosure. In addition, many modifications may be made to adapt to a particular situation or material to the teachings of the present disclosure without departing from the essential scope thereof. Therefore, it is intended that the present disclosure not be limited to the particular embodiments disclosed, but that the present disclosure will include all embodiments falling within the scope of the independent claims.

The various embodiments described above can be combined to provide further embodiments. All of the U.S. patents, U.S. patent application publications, U.S. patent application, foreign patents, foreign patent application and non-patent publications referred to in this specification and/or listed in the Application Data Sheet are incorporated herein by reference, in their entirety. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A harmonic rejection mixer for carrying out a frequency translation of a mixer input signal having a mixer input frequency, comprising:
an up-conversion mixer circuit structured to generate an intermediate signal that is a one-time oversampled sine wave signal by multiplying the mixer input signal with a first local oscillation signal having a first local oscillation frequency greater than the mixer input frequency,
a down-conversion mixer circuit structured to generate a mixer output signal that is an m-time oversampled sine wave signal by multiplying the intermediate signal with a second local oscillation signal having a second local oscillation frequency that is greater than the mixer input frequency.

2. The harmonic rejection mixer according to claim 1 wherein down-conversion mixer is structured to generate the mixer output signal with a mixer output frequency that is lower than the mixer input frequency.

3. The harmonic rejection mixer according to claim 1 wherein down-conversion mixer is structured to generate the mixer output signal as a base band signal.

4. The harmonic rejection mixer according to claim 1 wherein m is not equal to one.

5. The harmonic rejection mixer according to claim 1 wherein m is a multiple of 2.

6. The harmonic rejection mixer according to claim 1 wherein m is less than one.

7. The harmonic rejection mixer according to claim 1 wherein the up-conversion mixer and the down-conversion mixer are structured to generate the first and second local oscillation frequencies to be greater than the mixer input frequency.

8. The harmonic rejection mixer according to claim 1 wherein the up-conversion mixer and the down-conversion mixer are structured to generate the first and second local oscillation frequencies to be at least 10 times greater than the mixer input frequency.

9. The harmonic rejection mixer according to claim 1 wherein the up-conversion mixer and the down-conversion mixer are structured to generate the first and second local oscillation frequencies to be at least 5 times greater than the mixer input frequency.

10. The harmonic rejection mixer according to claim 1, further comprising a signal filter disposed between the up-conversion mixer and the down-conversion mixer and structured to filter the intermediate signal, the signal filter structured to be one of a low pass filter and a band pass filter.

11. The harmonic rejection mixer according to claim 1 wherein the up-conversion mixer and the down-conversion mixer are complex mixers.

12. The harmonic rejection mixer according to claim 1 wherein the up-conversion mixer and the down-conversion mixer are complex mixers and the signal filter is structured to be a complex filter.

13. A circuit, comprising:
a harmonic rejection mixer structured to reduce signal degradation caused by harmonics of a local oscillation signal, the mixer comprising:
an up-conversion mixer circuit structured to receive a mixer input signal having a mixer input frequency and to multiply the mixer input signal with a first local oscillation signal having a first local oscillation frequency that is greater than the mixer input frequency to generate an intermediate signal; and
a down-conversion circuit coupled to the up-conversion circuit and structured to multiply the intermediate signal with a second local oscillation signal that has a frequency substantially the same as the frequency of the first local oscillation frequency and generates a mixer output signal having suppressed harmonics that are suppressed with a 1/n characteristic in which n comprises the harmonic number.

14. The circuit of claim 13, comprising a low pass filter coupled to the up-conversion mixer and structured to receive the intermediate signal and to filter the intermediate signal to generate a filtered intermediate signal to be received at the down-conversion circuit.

15. The circuit of claim 14 wherein the down-conversion circuit is structured to generate the mixer output signal as a base band signal.

16. The circuit of claim 13, wherein the circuit includes a communication receiver of which the harmonic rejection mixer is a component.

17. The circuit of claim 13 wherein the circuit includes a communication transmitter of which the harmonic rejection mixer is a component.

18. A system, comprising:
a harmonic rejection mixer structured to frequency translate a mixer input signal having a mixer input frequency, the harmonic rejection mixer including:
an up-conversion mixer circuit structured to generate an intermediate signal that is a one-time oversampled sine wave signal by multiplying the mixer input signal with a first local oscillation signal having a first local oscillation frequency greater than the mixer input frequency, a down-conversion mixer circuit structured to generate a mixer output signal that is an m-time oversampled sine wave signal by multiplying the intermediate signal with a second local oscillation signal having a second local oscillation frequency that is greater than the mixer input frequency.

19. The system of claim 18 wherein down-conversion mixer is structured to generate the mixer output signal with a mixer output frequency that is lower than the mixer input frequency.

20. The system of claim 18 wherein down-conversion mixer is structured to generate the mixer output signal as a base band signal.

21. The system of claim 18 wherein the up-conversion mixer and the down-conversion mixer are structured to generate the first and second local oscillation frequencies to be greater than the mixer input frequency.

22. The system of claim 18 wherein the up-conversion mixer and the down-conversion mixer are structured to generate the first and second local oscillation frequencies are at least 10 times greater than the mixer input frequency.

23. The system of claim 18, further comprising a signal filter disposed between the up-conversion mixer and the down-conversion mixer and structured to filter the intermediate signal, the signal filter structured to be one of a low pass filter and a band pass filter.

24. The system of claim 18 wherein the up-conversion mixer and the down-conversion mixer are complex mixers.

25. The system of claim 18 wherein the up-conversion mixer and the down-conversion mixer are complex mixers and the signal filter is structured to be a complex filter.

* * * * *